(12) United States Patent
Liang et al.

(10) Patent No.: US 10,062,660 B2
(45) Date of Patent: Aug. 28, 2018

(54) ANISOTROPIC CONDUCTIVE FILM INCLUDING A REFLECTIVE LAYER

(71) Applicants: Rong-Chang Liang, Cupertino, CA (US); Chia-Teng Hsiao, Taipei (TW); Shun-Pin Yang, Toufen (TW); Jing-Den Chen, Union City, CA (US); Pi-Yang Chuang, Kaohsiung (TW)

(72) Inventors: Rong-Chang Liang, Cupertino, CA (US); Chia-Teng Hsiao, Taipei (TW); Shun-Pin Yang, Toufen (TW); Jing-Den Chen, Union City, CA (US); Pi-Yang Chuang, Kaohsiung (TW)

(73) Assignee: TRILLION SCIENCE, INC., Milpitas, CA (US)

( * ) Notice: Subject to any disclaimer, the term of this patent is extended or adjusted under 35 U.S.C. 154(b) by 0 days.

(21) Appl. No.: 15/631,443

(22) Filed: Jun. 23, 2017

(65) Prior Publication Data
US 2017/0287867 A1    Oct. 5, 2017

Related U.S. Application Data

(63) Continuation-in-part of application No. 14/638,306, filed on Mar. 4, 2015, now Pat. No. 9,871,177.

(51) Int. Cl.
*H01L 23/00* (2006.01)
*H01L 33/60* (2010.01)
(Continued)

(52) U.S. Cl.
CPC ............. *H01L 24/29* (2013.01); *H01L 24/73* (2013.01); *H01L 24/83* (2013.01); *H01L 25/0753* (2013.01); *H01L 33/56* (2013.01); *H01L 33/60* (2013.01); *H01L 33/62* (2013.01); *H05B 33/06* (2013.01); *H05B 33/22* (2013.01); *H01L 2224/2929* (2013.01); *H01L 2224/29082* (2013.01); *H01L 2224/29124* (2013.01);
(Continued)

(58) Field of Classification Search
CPC ........ Y10T 428/25; Y10T 428/28; C09J 7/00; C09J 11/04; C09J 9/02; G02F 1/29; H01L 33/60; H01L 24/29; H01L 25/0753; H01L 33/62; H05B 33/06; H05B 33/22; H05K 2201/10106; H05K 2201/2054; H05K 3/323
USPC ....................... 428/40.1, 343, 354
See application file for complete search history.

(56) References Cited

U.S. PATENT DOCUMENTS 8,802,214 B2    8/2014    Liang et al.
8,852,462 B2    10/2014   Umakoshi et al.
(Continued)

FOREIGN PATENT DOCUMENTS

JP    2014-160708    9/2014

OTHER PUBLICATIONS

TW, Office Action and Search Report with English translation, Taiwanese Patent Application No. 104134148, 15 pages (dated Oct. 20, 2017).
(Continued)

*Primary Examiner* — Catherine A. Simone
(74) *Attorney, Agent, or Firm* — Thompson Hine LLP

(57) ABSTRACT

An anisotropic conductive film (ACF) is disclosed. In one approach, the ACF includes a non-reflective adhesive layer including a top surface, a plurality of conductive particles included with the non-reflective adhesive layer, and a reflective adhesive layer disposed along the top surface of the non-reflective adhesive layer.

34 Claims, 11 Drawing Sheets

(51) Int. Cl.

| | | |
|---|---|---|
| *H01L 25/075* | (2006.01) | |
| *H01L 33/62* | (2010.01) | |
| *H01L 33/56* | (2010.01) | |
| *H05B 33/06* | (2006.01) | |
| *H05B 33/22* | (2006.01) | |

(52) U.S. Cl.
CPC ............ *H01L 2224/29139* (2013.01); *H01L 2224/29187* (2013.01); *H01L 2224/29387* (2013.01); *H01L 2224/29499* (2013.01); *H01L 2224/73204* (2013.01); *H01L 2224/83005* (2013.01); *H01L 2224/83203* (2013.01); *H01L 2224/83851* (2013.01); *H01L 2924/0542* (2013.01); *H01L 2924/0544* (2013.01); *H01L 2924/05341* (2013.01); *H01L 2924/12041* (2013.01); *H01L 2933/0066* (2013.01)

(56) References Cited

U.S. PATENT DOCUMENTS

| | | |
|---|---|---|
| 2011/0266578 A1 | 11/2011 | Kanisawa et al. |
| 2012/0295098 A1 | 11/2012 | Hwang et al. |
| 2013/0071636 A1 | 3/2013 | Lee et al. |
| 2013/0092310 A1 | 4/2013 | Ishigami |
| 2014/0141195 A1 | 5/2014 | Liang et al. |
| 2014/0175481 A1 | 6/2014 | Tischler |
| 2014/0261992 A1 | 9/2014 | Liang et al. |
| 2014/0312501 A1 | 10/2014 | Liang et al. |
| 2014/0368763 A1 | 12/2014 | Watanabe |
| 2016/0260875 A1 | 9/2016 | Liang et al. |

OTHER PUBLICATIONS

Liang, R.C. et al., "Fixed-Array Anisotropic Conductive Film (FACF) for Ultra Fine Pitch Applications," International Conference on Flexible and Printed Electronics (ICFPE) Proceedings, Paper S1-2-4, Hsinchu, Taiwan (2010).

Liang, R.C. et al., "Ultra Fine Pitch Anisotropic Conductive Film with Fixed Array of Conductive Particles," IDW'10 Proceeding, p. 1909, Paper FMC4-4, Fukuoka, Japan (2010).

"Ultra-Fine Pitch Fixed Array ACF," Tech on Chinese (Mar. 1, 2011).

Asai, S. et al., "Development of an Anisotropic Conductive Adhesive Film (ACAF) from Epoxy Resins," Journal of Applied Polymer Science, vol. 56, pp. 769-777 (1995).

PCT, International Search Report and Written Opinion; Patent Application No. PCT/US2016/020190 (dated May 11, 2016).

US, Non-Final Office Action, U.S. Appl. No. 14/638,306, 14 pages (dated Dec. 16, 2016).

US, Notice of Allowance, U.S. Appl. No. 14/638,306, 15 pages (dated Sep. 7, 2017).

ANISOTROPIC CONDUCTIVE FILM INCLUDING A REFLECTIVE LAYER

CROSS-REFERENCE TO RELATED APPLICATIONS

This application is a continuation-in-part application of U.S. application Ser. No. 14/638,306, filed Mar. 4, 2015. The content of U.S. application Ser. No. 14/638,306 is incorporated here by reference in its entirety.

FIELD

This disclosure relates generally to an anisotropic conductive film (ACF). More particularly, this disclosure relates to an ACF including a non-reflective adhesive layer and a reflective layer. The reflective layer may be an adhesive layer including a reflective additive, or a thin film deposited reflective layer. The reflective layer of the ACF results in improved light output and color purity characteristics when the ACF is part of a light-emitting or a light-transmitting device. Additionally, the reflective layer of the ACF may also improve attachment of the ACF to an electrode substrate.

BACKGROUND

Anisotropic conductive films (ACFs) are commonly used in flat panel display driver integrated circuit (IC) bonding. A typical ACF bonding process includes a first attachment step in which the ACF is attached onto the electrodes of the panel glass or flexible printed circuit (FPC) board, a second step in which the driver IC bonding pads are aligned with the panel electrodes, and a third step in which pressure and heat are applied to the bonding pads to melt and cure the ACF within seconds. The conductive particles of the ACF provide anisotropic electrical conductivity between the panel electrodes and the driver IC.

The need for ultra-fine pitch ACFs increases dramatically as the use of high definition displays in electronic devices such as smart phones and electronic tablets become the market trend. However, as the pitch size decreases, the size of the electrodes must also become smaller and a higher concentration of conductive particles is needed to provide the required particle density on the connected electrodes to assure satisfactory electrical conductivity or impedance.

The conductive particles of a traditional ACF are typically randomly dispersed in the ACF. There is a limitation on the particle density of such a dispersion system due to X-Y conductivity. In many bonding processes using traditional ACFs, only a small fraction of conductive particles are captured on electrodes. Most of the particles are actually flushed out to the spacing area between electrodes and in some cases result in undesirable shorts in the X-Y plane of the ACF. In a fine pitch bonding application, the conductive particles density should be high enough to have an adequate number of conductive particles bonded on each bonding pad. However, the probability of a short circuit or undesirable high-conductivity in the insulating area between two bonding pads also increases due to the high density of conductive particles and the characteristics of random dispersion.

Fixed-array ACFs overcome some of the shortcomings of traditional ACFs. The conductive particles of a fixed-array ACF are arranged in a pre-determined array pattern. Fixed-array ACFs have been recognized as one of the most effective approaches for achieving high resolution connection of ultra-fine pitch ICs. For example, a minimum bonding area as small as about 300 to 400 $\mu m^2$ and a minimum bonding space as narrow as 3 $\mu m$ have been demonstrated with fixed-array ACFs having a conductive particle density of at least 30,000 pieces per $mm^2$ ($pcs/mm^2$). Some references which discuss fixed-array ACFs include, for example, Liang, R. C. et al., "Fixed-Array Anisotropic Conductive Film (FACF) for Ultra Fine Pitch Applications," International Conference on Flexible and Printed Electronics (ICFPE) Proceedings, Paper S1-2-4, Hsinchu, Taiwan (2010); "Ultra Fine Pitch Anisotropic Conductive Film with Fixed Array of Conductive Particles," IDW'10 Proceeding, p. 1909, Paper FMC4-4, Fukuoka, Japan (2010); "Ultra-Fine Pitch Fixed Array ACF," Tech on Chinese (Mar. 1, 2011.); and U.S. Publication No. 2014/0141195 to Liang et al.

Fixed-array ACFs also have some drawbacks. In particular, attachment of the fixed-array ACF to the electrode substrate is not reproducible if the density of conductive particles of the fixed-array ACF is too high. A conductive particle density of, for example, 20,000 $pcs/mm^2$ or more may impede the attachment of the fixed-array ACF to the electrode substrate because the surface of the fixed-array ACF is predominately covered by an array of non-tacky conductive particles. Moreover, due to the high concentration of conductive particles such as gold (Au), nickel (Ni) (i.e., >30,000 $pcs/mm^2$) or other metalized polymer particles, the coloring of the fixed-array ACF may be relatively dark or brownish in color, and hazy. If the ACF is used in conjunction with light-emitting device such as a light emitting diode (LED) or an organic LED (OLED), then the dark color of the fixed-array ACF may negatively impact the light intensity and color purity emitted and/or reflected from the light-emitting device. Similar issues also exist if the fixed-array ACF is used in a light-transmitting or reflecting device such as a liquid-crystal display (LCD) display.

In one attempt to alleviate the deterioration in light intensity and color purity of the device a reflective pigment, such as titanium dioxide ($TiO_2$), was added to the existing adhesive layer of the light-emitting device. However, adding reflective pigment to the existing adhesive layer does not improve reflectivity, light output, or color purity of the device unless the concentration of reflective pigment is higher than a certain threshold value. However, a high concentration of the reflective pigment in the adhesive may tend to result in a significant degradation in particle transfer efficiency and uniformity in the microfluidic particle transfer process as well as the easiness of the electrode attachment step. In contrast, light scattering within a thick adhesive layer containing a low concentration of reflective pigment may result in an improvement in the percentage of reflectance, but a driver IC or LED chip with a thicker bump height would be required. This will result in a trade-off in the cost, package thickness and the capture rate of the conductive particles on the electrodes and bumps to be connected. The capture rate is defined as the percentage of the ACF conductive particles captured on the overlapped bonding areas of the bumps and electrodes after the main bonding process. For a given ACF, the higher the capture rate, the lower the connection resistivity and the lower the risk of short circuit because of the less conductive particles in the space between electrodes. Accordingly, there exists need in the art for an improved fixed-array ACF having a high concentration of conductive particles that results in improved reflectivity, light output, and color purity characteristics without the trade-off in manufacturing yield, uniformity, and attachment or bonding properties of the ACF, and the capture rate of conductive particles and the reliability of the connected electrodes/chips after bonding when used in light-emitting and light-transmitting or reflective devices.

SUMMARY

In one aspect, provided herein is an anisotropic conductive film (ACF). The ACF includes a non-reflective adhesive layer including a top surface, conductive particles at least partially embedded into a surface of the non-reflective adhesive layer, and a reflective adhesive layer disposed along the top surface of the non-reflective adhesive layer. The reflective adhesive layer includes at least 30% reflective particles by percentage weight of the reflective adhesive layer.

In some embodiments, the conductive particles are at least partially embedded in a bottom surface of the non-reflective adhesive layer or a top surface of the non-reflective adhesive layer.

In some embodiments, the ACF is a fixed-array ACF that includes an array of the conductive particles arranged in predetermined locations along a surface of the non-reflective adhesive layer. For example, the ACF can be a fixed-array ACF that includes an array of the conductive particles arranged in predetermined locations along the bottom surface of the non-reflective adhesive layer. In some embodiments, the ACF is a fixed-array ACF and includes multiple arrays of conductive particles arranged in predetermined locations along a surface of the non-reflective adhesive layer. For example, the ACF can be a fixed-array ACF that includes multiple arrays of conductive particles arranged in predetermined locations along the bottom surface of the non-reflective adhesive layer.

In some embodiments, the conductive particles are partially embedded along the bottom surface of the non-reflective adhesive layer. For example, the ACF can be a fixed-array ACF including an array of the conductive particles arranged in predetermined locations and partially embedded along the bottom surface of the non-reflective adhesive layer.

The reflective particles can be selected from the group consisting of reflective, retro-reflective particles, and combinations thereof. In some embodiments, the reflective particles are an electrical insulator. The reflective particles can be a high refractive index oxide selected from the group consisting of indium-tin-oxide (ITO), zinc oxide (ZnO), titanium dioxide ($TiO_2$), indium-zinc-oxide (IZO), tin oxide (SnO), zirconium oxide ($ZrO_2$), their alloys thereof, and combinations thereof. In some embodiments, the reflective particles comprise $TiO_2$.

The reflective adhesive layer can include filler particles selected from the group consisting of zinc oxide (ZnO), boron nitride (SN), silicon dioxide ($SiO_2$), aluminium oxide ($Al_2O_3$), calcium carbonate ($CaCO_3$), calcium sulfate ($CaSO_4$), barium sulfate ($BaSO_4$), and combinations thereof.

In some embodiments, the reflective layer includes about 40 weight percent (wt. %) to about 75 wt. % reflective particles.

The ACF can further include a release substrate disposed along a top surface of the reflective layer.

In some embodiments, the reflective adhesive layer has a thickness ranging from about 1 µm to about 15 µm. For example, the reflective adhesive layer has a thickness ranging from about 3 µm to about 8 µm.

In some embodiments, the non-reflective adhesive layer includes at least 20,000 pcs/mm² of the conductive particles.

In another aspect, provided herein is a light-emitting device. The light emitting device includes a light-emitting housing, an electrode substrate, and an ACF. The light-emitting housing includes a plurality of light-emitting elements or chips. The chips include a chip bump (e.g., one, two, or two or more chip bumps) for electrical connection to the electrodes of the electrode substrate. The ACF electrically connects the light-emitting elements or the chip bumps to the electrodes of the electrode substrate. Further, the ACF includes a non-reflective adhesive layer including a top surface, a plurality of conductive particles included with the non-reflective adhesive layer, and a reflective adhesive layer disposed along the top surface of the non-reflective adhesive layer. The reflective adhesive layer includes at least 30% reflective particles by percentage weight.

The chips can each include two bumps for the "+" and "−" electrodes. In some aspects, the two bumps can be arranged coaxially and appear as a single bump.

In some embodiments, the conductive particles of the light emitting device are non-randomly dispersed. For example, the ACF can begin as a fixed-array ACF including an array of the conductive particles arranged in predetermined locations and, after the bonding process, the array of conductive particles can be a disordered, disrupted, or perturbed array. For example, the turbulent flow of the adhesive induced by high temperature and pressure during the bonding process may disrupt the fixed array of conductive particles. The ACF can be partially cured or fully cured by the bonding processes. In some embodiments, the ACF may be further cured by a post curing step after the bonding process.

In some embodiments, the conductive particles of the light emitting device are at or near an interface between the non-reflective adhesive layer and the reflective adhesive layer. Further, the conductive particles of the light emitting device can be substantially in the form of a perturbed array. For example, the conductive particles of the light emitting device can be substantially in the form of a perturbed array at or near an interface of the reflective layer and non-reflective layer. The conductive particles of the light emitting device can also be substantially in the form of a perturbed array near the chips or the electrodes to be bonded.

In some embodiments, the reflective layer comprises about 40 wt. % to about 75 wt. % reflective particles. The reflective particles can be a high refractive index oxide selected from the group consisting of indium-tin-oxide (ITO), zinc oxide (ZnO), titanium dioxide ($TiO_2$), indium-zinc-oxide (IZO), tin oxide (SnO), zirconium oxide ($ZrO_2$), their alloys thereof, and combinations thereof. In some embodiments, the reflective particles include $TiO_2$.

The reflective layer can further include filler particles selected from the group consisting of zinc oxide (ZnO), boron nitride (SN), silicon dioxide ($SiO_2$), aluminium oxide ($Al_2O_3$), calcium carbonate ($CaCO_3$), calcium sulfate ($CaSO_4$), barium sulfate ($BaSO_4$), and combinations thereof.

In some embodiments, the ACF of the light emitting device further includes quantum dots in the non-reflective layer, the reflective layer, or both.

In another aspect, provided herein is a light-reflecting or transflecting device. The light-reflecting or transflecting device includes a housing, an electrode substrate, an ACF, and a plurality of chip bumps or thin film transistors. The ACF electrically connects the housing and the electrode substrate. The ACF includes a non-reflective adhesive layer including a top surface, a plurality of conductive particles included with the non-reflective adhesive layer, and a reflective adhesive layer disposed along the top surface of the non-reflective adhesive layer. The reflective adhesive layer includes at least 30% reflective particles by percentage weight. The plurality of chip bumps or thin film transistors are in contact with at least a portion of the conductive particles.

In some embodiments, the conductive particles of the light-reflecting or transflecting device are non-randomly dispersed. For example, the ACF can begin as a fixed-array ACF including an array of the conductive particles arranged in predetermined locations and, after the bonding process, the array of conductive particles can be a disordered, disrupted, or perturbed array. For example, the turbulent flow of the adhesive induced by high temperature and pressure during the bonding process may disrupt the fixed array of conductive particles. The ACF can be partially cured or fully cured by the bonding processes. In some embodiments, the ACF may be further cured by a post curing step after the bonding process.

In some embodiments, the conductive particles of the light-reflecting or transflecting device are at or near an interface between the non-reflective adhesive layer and the reflective adhesive layer. Further, the conductive particles of the light-reflecting or transflecting device can be substantially in the form of a perturbed array. For example, the conductive particles of the light-reflecting or transflecting device can be substantially in the form of a perturbed array at or near an interface of the reflective layer and non-reflective layer. The conductive particles of the light-reflecting or transflecting device can also be substantially in the form of a perturbed array near the chips or the electrodes to be bonded.

In some embodiments, the reflective layer of the light-reflecting or transflecting device includes about 40 wt. % to about 75 wt. % reflective particles. The reflective particles can be high refractive index oxides selected from the group consisting of indium-tin-oxide (ITO), zinc oxide (ZnO), titanium dioxide ($TiO_2$), indium-zinc-oxide (IZO), tin oxide (SnO), zirconium oxide ($ZrO_2$), their alloys thereof, and combinations thereof. In some embodiments, the reflective particles include $TiO_2$.

The reflective layer of the light-reflecting or transflecting device can further include filler particles selected from the group consisting of zinc oxide (ZnO), boron nitride (SN), silicon dioxide ($SiO_2$), aluminium oxide ($Al_2O_3$), calcium carbonate ($CaCO_3$), calcium sulfate ($CaSO_4$), barium sulfate ($BaSO_4$), and combinations thereof.

In some embodiments, the ACF of the light-reflecting or transflecting device further includes quantum dots in the non-reflective layer, the reflective layer, or both.

In another aspect, an anisotropic conductive film (ACF) is disclosed, and includes a non-reflective adhesive layer including a top surface, an array of conductive particles included with the non-reflective adhesive layer (e.g., partially embedded in the bottom surface of the non-reflective adhesive layer), and a reflective adhesive layer disposed along the top surface of the non-reflective adhesive layer. Non-random arrays of conductive particles are disclosed, for example, in U.S. Pat. Nos. 9,475,963 and 8,802,214. The reflective layer includes at least five percent reflective particles by percentage weight. In another aspect, an ACF is disclosed, and includes a non-reflective adhesive layer including a top surface, an array of conductive particles included with the non-reflective adhesive layer (e.g., partially embedded in the bottom surface of the non-reflective adhesive layer), and a thin film deposited reflective layer disposed along the top surface of the non-reflective adhesive layer. The thin film deposited reflective layer includes a second top surface. The ACF also includes a secondary adhesive layer disposed along the second top surface of the thin film deposited reflective layer. The secondary adhesive layer includes a third top surface on which the reflective secondary adhesive layer is in contact with a release substrate.

In some embodiments, the reflective layer includes a surface which is in direct contact with a release substrate.

In yet another aspect, a light-emitting device is disclosed. The light-emitting device includes a plurality of LED chips with chip bumps for connecting to the driving electrodes or traces, and an ACF electrically connecting the LED chips and the electrode substrate. The ACF includes a non-reflective adhesive layer including a top surface, an array of conductive particles partially embedded in the bottom surface of the non-reflective adhesive layer, and a reflective adhesive layer disposed along the top surface of the non-reflective adhesive layer. The reflective layer comprises at least five percent reflective particles by percentage weight.

In still another embodiment, a light-reflecting device is disclosed. The light-reflecting device includes an electrode substrate, a plurality of LED chips with bumps for connecting to the driving electrodes or traces, and an ACF electrically connecting the LED chips and the electrode substrate through the bumps. The ACF includes a non-reflective adhesive layer including a top surface, an array of conductive particles partially embedded in the bottom surface of the non-reflective adhesive layer, and a reflective adhesive layer disposed along the top surface of the non-reflective adhesive layer. The reflective layer includes at least five percent reflective particles by percentage weight.

Other objects and advantages of the disclosed method and system will be apparent from the following description, the accompanying drawings, and the appended claims.

DETAILED DESCRIPTION

Figure 1:
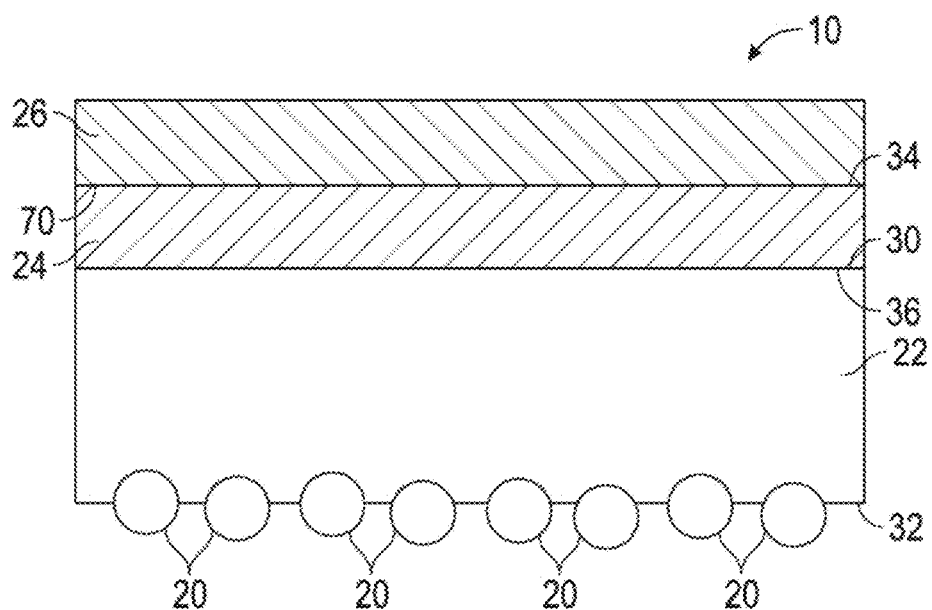
FIG. 1 is a side cross-sectional view of an exemplary ACF including a reflective adhesive layer.

FIG. 1 is a schematic side cross-sectional view of an exemplary anisotropic conductive film (ACF) 10. The ACF 10 includes an array of conductive particles 20, a first, non-reflective adhesive layer 22, a second, reflective adhesive layer 24, and a release substrate 26. Those of ordinary skill in the art will readily appreciate that the non-reflective adhesive layer 22, the reflective adhesive layer 24, and the release substrate 26 are not drawn to scale in the figures, and the release substrate 26 may actually be thicker (e.g., significantly thicker) than the non-reflective adhesive layer 22 and the reflective adhesive layer 24. The non-reflective adhesive layer 22 includes a first, top surface 30 as well as a second, bottom surface 32. The reflective adhesive layer 24 also includes a first, top surface 34 as well as a second, bottom surface 36. As explained in greater detail below and shown in FIG. 2, in an alternative embodiment an ACF 100 may include a thin film deposited reflective layer 124 instead of the reflective adhesive layer 24. The ACF 100 also includes a separate, additional layer of adhesive 128.

Turning back to FIG. 1, the release substrate 26 may be provided along the top surface 34 of the reflective adhesive layer 24, and is used to carry the ACF 10. The reflective adhesive layer 24 is disposed along the top surface 30 of the non-reflective adhesive layer 22, and the conductive particles 20 may be disposed along the bottom surface 32 of the non-reflective adhesive layer 22. Any of the conductive particles 20 (e.g., conductive particles with a narrow particle size distribution) for use in ACFs may be used in practicing this disclosure. Some examples of conductive particles 20 that may be used for the ACF 10 are disclosed in commonly owned U.S. Pat. No. 8,802,214 to Liang et al., which is incorporated herein in its entirety by reference. The concentration of the particles to achieve good electrical connection of the device with minimum short or leakage current can be dependent on the size of the conductive particle and the area of the chip bump or thin film transistors to be connected. In some embodiments, the non-reflective adhesive layer (e.g., non-reflective adhesive layer 22) includes an array of conductive particles with a concentration of about 20,000 to about 50,000 pcs/mm$^2$, about 25,000 to about 45,000 pcs/mm$^2$, or about 30,000 to about 40,000 pcs/mm$^2$. In some embodiments, particularly for ultra-fine resolution devices, the non-reflective adhesive layer (e.g., non-reflective adhesive layer 22) includes an array of 2.5-3.5 micrometer (diameter) conductive particles with a concentration of about 20,000 to about 50,000 pcs/mm$^2$, about 25,000 to about 45,000 pcs/mm$^2$, or about 30,000 to about 40,000 pcs/mm$^2$ of conductive particles (e.g., conductive particles 20) partially embedded into the non-reflective adhesive layer (e.g., the non-reflective adhesive layer 22).

As used herein, the term "about" can allow for a degree of variability in a value or range, for example, within 10%, within 5%, or within 1% of a stated value or of a stated limit of a range.

In some embodiments, the ACF 10 is a non-random or fixed-array ACF. That is, the conductive particles 20 are arranged in predetermined locations along the bottom surface 32 of the non-reflective adhesive layer 22. The '214 patent to Liang discloses a process for manufacture of a fixed-array ACF. However, although a fixed-array ACF is described, it is to be understood that the present disclosure is not limited to only a fixed-array ACF. Instead, the disclosure may also apply to traditional ACFs as well, where the conductive particles 20 are randomly dispersed within the non-reflective adhesive layer 22.

In the embodiment as shown in FIG. 1, the conductive particles 20 are partially embedded within the non-reflective adhesive layer 22; however, it is to be understood that in another embodiment, the conductive particles 20 may be completely embedded within the non-reflective adhesive layer 22 as well. The conductive particles 20 may be transferred from a filled microcavity array onto the non-reflective adhesive layer 22 to create the ACF 10, and such as is disclosed in the '214 patent to Liang. In some embodiments, the non-reflective adhesive layer includes more than one array of conductive particles. For example, the non-reflective adhesive layer can include two arrays of conductive particle or three or more arrays of conductive particles.

The non-reflective adhesive layer 22 may be thermoplastic, thermoset, or their precursors. Useful adhesives include, but are not limited to, pressure sensitive adhesives, hot melt adhesives, heat or radiation curable adhesives. The adhesives may include, for example, epoxide, phenolic resin, amine-formaldehyde resin, polybenzoxazine, polyurethane, cyanate esters, acrylics, acrylates, methacrylates, vinyl polymers, rubbers such as poly(styrene-co-butadiene) and their block copolymers, polyolefins, polyesters, unsaturated polyesters, vinyl esters, epoxy resins, phenoxy resins, acrylic resins, polycaprolactone, polyethers, polyamides, or combinations thereof. Epoxide, cyanate esters, multifunctional acrylates, or combinations thereof are particularly useful. Catalysts or curing agents including latent curing agents may be used to control the curing kinetics of the adhesive. Useful curing agents for epoxy resins include, but are not limited to, dicyanodiamide (DICY), adipic dihydrazide, 2-methylimidazole and its encapsulated products such as Novacure HX dispersions in liquid bisphenol A epoxy from Asahi Chemical Industry, amines such as ethylene diamine, diethylene triamine, triethylene tetraamine, BF3 amine adduct, Amicure from Ajinomoto Co. Inc., sulfonium salts such as diaminodiphenylsulphone, p-hydroxyphenyl benzyl methyl sulphonium hexafluoroantimonate. Coupling agents including, but are not limited to, titanate, zirconate and silane coupling agents such as glycidoxypropyl trimethoxysilane and 3-aminopropyl trimethoxy-silane may also be used to improve the durability of the ACF. The effect of curing agents and coupling agents on the performance of epoxy-based ACFs can be found in S. Asai, et al., *J. Appl. Polym. Sci.*, 56, 769 (1995). The entire paper is hereby incorporated by reference in its entirety.

In some embodiments, the non-reflective adhesive layer includes reflective particles. For example, the non-reflective adhesive layer can include $TiO_2$. The non-reflective can include 0 wt. % $TiO_2$ to about 20 wt. % $TiO_2$ or about 0.1 wt. % $TiO_2$ to about 15 wt. % $TiO_2$. In some embodiments the non-reflective adhesive layer includes about 1% to about 10% $TiO_2$. In some embodiments, the non-reflective adhesive layer includes about 1 wt. % to about 4 wt. % $TiO_2$ or about 4 wt. % to about 10 wt. % $TiO_2$.

The reflective adhesive layer, such as reflective adhesive layer 24, includes reflective particles and can include an acrylate copolymer, a phenoxy resin, an epoxy resin, a curing agent, or combinations thereof. In some embodiments, the reflective adhesive layer can further include a filler such as silica. The reflective adhesive layer can also include a heterocyclic compound. Further, the reflective adhesive layer can also include an epoxy functional silane.

The reflective adhesive layer can also include a glycidyl ether such as a polyglycidyl ether. In some embodiments, the reflective adhesive layer further includes a surfactant. In some embodiments, the reflective adhesive layer includes reflective particles, an acrylate copolymer, a phenoxy resin, an epoxy resin, a curing agent, an epoxy functional silane, a polyglycidyl ether, a silica, and a heterocyclic compound, or combinations thereof.

As used herein, the terms "a," "an," or "the" are used to include one or more than one unless the context clearly dictates otherwise.

Figure 3:
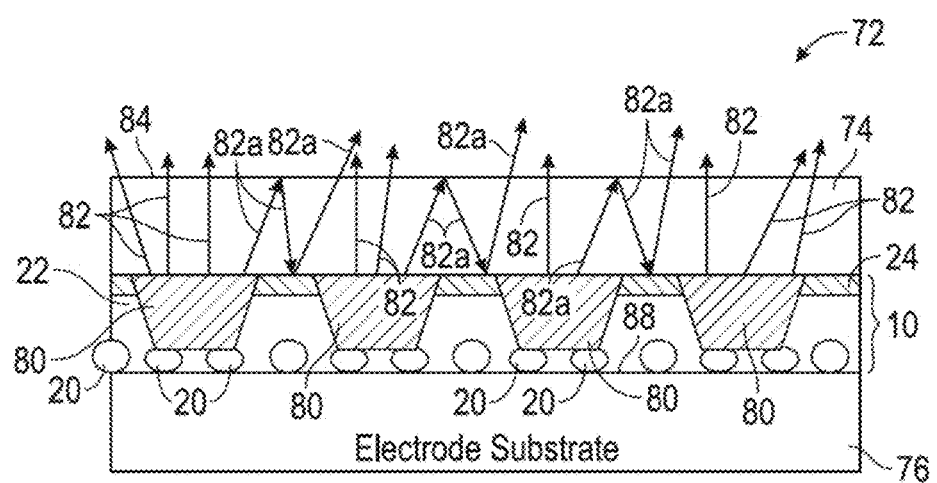
FIG. 3 is an exemplary light-emitting device including the disclosed ACF shown in FIG. 1.

The reflective adhesive layer, such as reflective adhesive layer 24, includes reflective particles that can improve the reflectivity of an ACF, such as ACF 10. In addition to improved reflectivity, the reflective particles can also improve attachment of an ACF to an electrode during prebonding or the attachment step. FIG. 3 shows ACF 10 attached to an electrode substrate 76 (shown in FIG. 3) during pre-bonding. The chips can be subsequently positioned onto the ACF 10 and bonded under high temperature (about 150-190° C.) and pressure (about 1-100 MPa). Not to be bound by theory, it is believed that the reflective particles in the reflective adhesive layer may either function as a local defect to provide crack initiation and propagation required to fracture the reflective adhesive layer at the border of a bonding and a non-bonding area, or alternatively, reduces of the adhesion the ACF to the release substrate.

In some embodiments, an array of micro LED chips may be first transferred from an epitaxy wafer to a temporary receiving substrate and subsequently laminated with the ACF 10 either before or after the electrode attachment step.

In some embodiments, the reflective particles of the reflective adhesive layer may be a white pigment such as titanium dioxide ($TiO_2$). However, it is to be understood that the reflective particles are not limited to titanium dioxide. For example, the reflective particles may be other types of white pigments such as, but not limited to, zinc oxide (ZnO) and zirconium oxide ($ZrO_2$). In some embodiments, the reflective particles may be hollow polymer particles, such as plastic pigments. In particular, the reflective particles may be hollow cross-linked polymeric particles such as Dow's ROPAQUE™ hollow-sphere polymeric pigments. In still other embodiments, the reflective particles may be reflective or retro-reflective particles that are either electrical insulators or electrical conductors encapsulated with an electrical insulator. Some examples of reflective or retro-reflective particles are hollow glass microspheres, mica, cholesteric liquid crystal pigment particles, and high refractive index oxides. Some examples of high refractive index oxides include, but are not limited to, indium-tin-oxide (ITO), zinc oxide (ZnO), titanium dioxide ($TiO_2$), indium-zinc-oxide (IZO), tin oxide (SnO), zirconium oxide ($ZrO_2$) and their alloys thereof. In some embodiments, low index colorless fillers such as boron nitride (SN), silicon oxide ($SiO_2$), calcium carbonate ($CaCO_3$), calcium sulfate ($CaSO_4$), barium sulfate ($BaSO_4$), or combinations thereof may be used to improve the reflectance of the pigmented adhesive layer.

The shape of the reflective particles may be, for example, substantially spherical, scale-like (e.g., platelet-like), or needle-like. If the reflective particles have a substantially spherical shape, it is to be understood that if a diameter of the reflective particle is too small, then light reflectance may suffer. However, if the diameter is too large, then anisotropic connection due to the conductive particles tends to be inhibited. In some embodiments, the average particle size of the reflective particles may range from about 0.05 μm to about 5 μm. For example, the average particle size of the reflective particles can be about 0.05 μm to about 1 μm, about 0.1 μm to about 0.7 μm, or about 0.1 to about 0.4 μm. In some embodiments, the average particle size of the reflective particles is about 0.2 μm to about 0.35 μm. The reflective particles can also be a scale-like shape, and have a diameter of about 0.1 μm to about 10 For example, the reflective particles can have a scale-like shape with a diameter of about 0.2 μm to about 10 and a thickness from about 0.01 μm to about 2 μm or preferably about 0.1 μm to about 1.5 If the reflective particle is covered with an insulating coating, the size of the reflective particle is a size including the insulating coating.

It is to be understood that if the percentage of reflective particles within the reflective adhesive layer 24 is too high, this may result in reduced adhesion to the electrode substrate 76 or the chip bump 80 (shown in FIG. 3). Too high of a percentage of reflective particles may also result in reduced impact resistance, thermal shock resistance, and humidity resistance.

Likewise, if the percentage of reflective particles within the adhesive layer 24 is too low, then the light reflectance may suffer.

The reflective adhesive layer 24 provides a reflectivity of at least 20%. In some embodiments, the reflective adhesive layer 24 provides reflectivity of at least 30%, such as at least 50%. For example, the reflective adhesive layer can provide a reflectivity of about 50% to about 90%, about 50% to about 80%, or about 50% to about 70%.

The reflective adhesive layer 24 can include at least 5% reflective particles by percentage weight (wt. %), such as at least 10% wt. %. In some embodiments, the reflective adhesive layer includes about 40 wt. % to about 90 wt. % reflective particles, about 50 wt. % to about 75 wt. % reflective particles, or about 60 wt. % to about 70 wt. % reflective particles. For example, the reflective adhesive layer can include about 60 wt. % to about 70 wt. % reflective particles.

In other embodiments, the percentage of reflective particles within the reflective adhesive layer 24 may range from about 30 wt. % to about 70 wt. %, which results in a light reflectance of at least 50%.

The acrylate copolymer can be an acrylic block copolymer such as a polymethylmethacrylate (PMMA)-block-polybutylacrylate (PBuA)-block-PMMA copolymer. In some embodiments the acrylate copolymer is a PMMA/dimethylacrylamide (DMA)-block-PBuA-block-PMMA/DMA copolymer such as M52N from Arkema Corporation. The acrylate copolymer can also be a MAM NANOSTRENGTH® block copolymer terminated in PMMA end blocks available from Arkema Corporation, particularly (PMMA-PBuA-PMMA) block copolymers such as M51, M52, and M53 and their functionalized derivatives.

In some embodiments, the reflective adhesive layer includes about 2 wt. % to about 30 wt. %, about 3 wt. % to about 25 wt. %, or about 4 wt. % to about 20 wt. % of the acrylate copolymer. For example, the reflective adhesive layer can include about 5 wt. % to about 15 wt. % of the acrylate copolymer. In some embodiments, the reflective adhesive layer includes about 2 wt. % to about 30 wt. % of a PMMA/DMA-block-PBuA-block-PMMA/DMA copolymer. For example, the reflective layer includes about 5 wt. % to about 15 wt. % of a PMMA/DMA-block-PBuA-block-PMMA/DMA copolymer such as M52N from Arkema Corporation.

The phenoxy resin can be a phenoxy resin having a $M_w$ of about 15,000 to about 1,000,000, about 20,000 to about 100,000, or about 25,000 to about 80,000. For example, the phenoxy resin can have a Mw of about 30,000 to about 65,000. In some embodiments, the phenoxy resin can include PKFE ($M_w$ of about 60,000), PKHJ ($M_w$ of about 57,000), PKHH ($M_w$ of about 52,000), PKHB ($M_w$ of about 32,000), or combinations thereof. PKFE, PKHJ, PKHH, and PKHB are available from InChem Corp and Gabriel Performance Products. In some embodiments, the reflective adhesive layer can include PKFE and PKHB.

In some embodiments, the reflective adhesive layer includes about 5 wt. % to about 40 wt. % or about 10 wt. % to about 30 wt. % of a phenoxy resin. For example, the reflective adhesive layer can include about 15 wt. % to about 25 wt. % of a phenoxy resin. In some embodiments the reflective adhesive layer includes about 10 wt. % to about 20 wt. % of a phenoxy resin having a $M_w$ of about 60,000 and about 1 wt. % to about 5 wt. % of a phenoxy resin having a $M_W$ of about 32,000.

In some embodiments, the epoxy resin includes a bisphenol A epoxy resin, a bisphenol F epoxy resin, a phenol novolac epoxy resin, a cresol novolac epoxy resin, a multifunctional glycidyl ether such as epoxidized aliphatic alcohols, or combinations thereof. Examples of commercially available diglycidylethers of bisphenol A include those available under the trade names EPON 828, EPON 1001, EPON 1310, and EPON 1510 from Hexion Specialty Chemicals GmbH (Rosbach, Germany), those available under the trade name D.E.R. from Dow Chemical Co. (e.g., D.E.R. 331, 332, and 334), those available under the trade name EPICLON from Dainippon Ink and Chemicals, Inc. (e.g., EPICLON 840 and 850) and those available under the trade name YL-980 from Japan Epoxy Resins Co., Ltd. Examples of bisphenol F epoxy resins include EPOTOHTO YDF-8170 from Tohto Kasei Co., Ltd. and YL 983U from Japan Epoxy Resins Co., Ltd. An example of a phenol novolac epoxy resin is EPALLOY® 8330 from CVC Thermoset Specialties, Moorestown, N.J. An example of a cresol novolac epoxy resin is EPICLON N-695 from DIC Corporation. Examples of multifunctional aliphatic glycidyl ethers include ERISYS GE 30, GE-40, GE-60 also from CVC Thermoset Specialties.

In some embodiments, the reflective adhesive layer includes about 0.5 wt. % to about 10 wt. % or about 1 wt. % to about 7 wt. % of an epoxy resin. For example, the reflective adhesive layer can include about 2 wt. % to about 5 wt. % of the epoxy resin. In some embodiments, the reflective layer includes about 0.1 wt. % to about 4 wt. % or about 0.5 wt. % to about 2 wt. % of a bisphenol A epoxy resin. The reflective layer can also include about 0.1 wt. % to about 2 wt. % or about 0.2 wt. % to about 1 wt. % of a bisphenol F epoxy resin. In some embodiments, the reflective layer includes about 0.1 wt. % to about 2 wt. % or about 0.2 wt. % to about 1 wt. % of a phenol novolac epoxy resin. In some embodiments, the reflective layer includes about 0.1 wt. % to about 5 wt. % or about 1.0 wt. % to about 3 wt. % of a cresol novolac epoxy resin.

In some embodiments, the reflective adhesive layer further includes a curing agent such as an encapsulated curing agent. The curing agent can be an imidazole-based latent curing agent prepared by adducting an imidazole compound with an epoxy compound and then blocking or encapsulating the surface of the obtained product with an isocyanate compound can also be used. Examples of encapsulated latent curing agents as taught in Liang et al., U.S. Pat. Nos. 8,481,612 and 8,067,484 and commercially available latent hardeners include Novacure HX and HXA series from Asahi Kasei Chemicals Corporation. In some embodiments, the curing agent is Novacure HXA-3922HP. The reflective layer can include about 1 wt. % to about 40 wt. %, about 2 wt. % to about 35 wt. % or about 5 wt. % to about 30 wt. % of a curing agent such as HXA-3922HP.

The reflective adhesive layer can also include a filler such as silica. The silica can be fumed silica. Other fillers include, but are not limited to, zinc oxide (ZnO), boron nitride (BN), silicon oxide ($SiO_2$), aluminium oxide ($Al_2O_3$), calcium carbonate ($CaCO_3$), calcium sulfate ($CaSO_4$), and barium sulfate ($BaSO_4$). In some embodiments, the reflective adhesive layer includes a low surface area silica such as CAB-O-SIL® L90 (having a surface area of about 90 $m^2/g$). In some embodiments, the reflective layer includes a high surface area silica such as CAB-O-SIL® TS530 (having a surface area of about 225 $m^2/g$). The surface area of the silica can be measured by the Brunauer-Emmett-Teller method. The low surface area silica can have a surface area of about 50 $m^2/g$ to about 150 $m^2/g$. The high surface area silica can have a surface area of about 155 $m^2/g$ to about 300 $m^2/g$. In some embodiments the reflective adhesive layer includes at least one low surface area silica and at least one high surface area silica.

In some embodiments, the reflective adhesive layer includes about 0.2 wt. % to about 5 wt. % or about 0.5 wt. % to about 3 wt. % of a filler such as silica. For example, the reflective adhesive layer can include about 0.8 wt. % to about 2 wt. % silica. In some embodiments, the reflective layer includes about 0.2 wt. % to about 4 wt. %, about 0.4 to about 3 wt. %, or about 0.6 wt. % to about 2 wt. % of a low surface area silica such as CAB-O-SIL® L90. In some embodiments, the reflective layer includes about 0.1 wt. % to about 2 wt. %, about 0.1 wt. % to about 1 wt. %, or about 0.1 wt. % to about 0.5 wt. % of a high surface area silica such as CAB-O-SIL® TS530.

In some embodiments, the reflective adhesive layer includes a heterocyclic compound, such as 2-methylbenzothiazole, as a corrosion inhibitor as well as a mild co-catalyst for the epoxide polymerization. Examples of heterocyclic compounds include thiazoles such as benzothiazole, 2-methylbenzothiazole, 2-mercaptobenzothiazole, 2-mercaptobenzothiazole zinc salt, di-2-benzothiazolyl disulfide, N-cyclohexylbenzothiazole, N-cyclohexyl-2-benzothiazole sulfenamide, N-oxydiethylene-2-benzothiazole sulfenamide, N-tert-butyl-2-benzothiazole sulfenamide, 2-(4'-morpholinodithio)benzothiazole, N,N-dicyclohexyl-2-benzothiazole sulfenamide, and N-tert-butyl-2-benzothiazolyl sulfenamide; and thiadiazoles such as 1,3,4-thiadiazole, 2-amino-1,3,4-thiadiazole, and 2-amino-5-mercapto-1,3,4-thiadiazole. In some embodiments, the heterocyclic compound is 2-methylbenzothiazole.

The reflective adhesive layer can include about 0.1 wt. % to about 5 wt. %, or about 0.2 wt. % to about 2.0 wt. %, or about 0.3 wt. % to about 0.8 wt. % of a heterocyclic compound. For example, the reflective adhesive layer can include about 0.1 wt. % to about 5 wt. %, about 0.2 wt. % to about 2.0 wt. %, or about 0.3 wt. % to about 0.8 wt. % of 2-methylbenzothiazole.

The reflective adhesive layer can also include an epoxy functional silane. Examples of epoxy functional silanes include (3-glycidoxypropyl)trimethoxysilane, (3-glycidoxypropyl)triethoxysilane, (3-glycidoxypropyl)triisopropoxysilane, beta-(3,4-epoxycyclohexyl)ethyltrimethoxysilane, beta-(3,4-epoxycyclohexyl)ethyltriethoxysilane, (3-glycidoxypropyl)trimethoxysilane, and beta-(3,4-epoxycyclohexyl)ethyltrimethoxysilane. The epoxy functional silane can include Silquest A-186 silane, Silquest A-187 silane (e.g., γ-glycidoxypropyltriethoxysilane) (both available from Momentive), or a combination thereof.

In some embodiments, the reflective adhesive layer includes about 0.01 wt. % to about 2 wt. %, or about 0.1 wt. % to about 1 wt. % of an epoxy functional silane. For example, the reflective adhesive layer can include about 0.01 wt. % to about 2 wt. % or about 0.1 wt. % to about 1 wt. % of Silquest A-187 silane.

The reflective adhesive layer can further include a glycidyl ether such as a polyglycidyl ether. The polyglycidyl ether can include a diglycidyl ether, a triglycidyl ether, a tetraglycidyl ether or combinations thereof. In some embodiments, the glycidyl ether includes trimethylolpropane triglycidyl ether, pentaerythritol tetraglycidyl ether, multifunctional glycidyl ethers (e.g., ERISYS® GE-30, GE-40, GE-60 from CVC Thermoset Specialties) or combinations thereof. The reflective adhesive layer can include about 0.1 wt. % to about 15 wt. %, about 0.3 wt. % to about 10 wt. %, or about 0.5 to about 7 wt. % of a glycidyl ether. For example, the reflective adhesive layer can include about 0.1 wt. % to about 15 wt. %, about 0.3 wt. % to about 10 wt. %, or about 0.5 to about 7 wt. % of trimethylolpropane triglycidyl ether. In some embodiments, the reflective adhesive layer can include about 0.1 wt. % to about 15 wt. %, about 0.3 wt. % to about 10 wt. %, or about 0.5 to about 7 wt. % of pentaerythritol tetraglycidyl ether.

In some embodiments, the reflective adhesive layer includes a surfactant. The surfactant can include a silicone based surfactant, a fluoro-surfactant, a hydrocarbon surfactant, or combinations thereof. The silicone based surfactant can be an organosilicone surfactant. The silicone based surfactant can include Silwet L-7600; Silwet L-7608; Silwet L-7622 or combinations thereof. In some embodiments, the surfactant includes Silwet L-7622.

In some embodiments, the reflective adhesive layer includes about 0.01 wt. % to about 1 wt. % or about 0.1 wt. % to about 0.5 wt. %, of a silicone based surfactant. For example, the reflective adhesive layer can include about 0.01 wt. % to about 2 wt. %, about 0.05 wt. % to about 1 wt. %, or about 0.1 to about 1 wt. % of Silwet L-7622.

In some embodiments, the reflective adhesive layer includes TiO$_2$, an acrylate copolymer, a phenoxy resin, an epoxy resin, a curing agent, an epoxy functional silane, polyglycidyl ether, a fumed silica, a heterocyclic compound, and combinations thereof. For example, the reflective adhesive layer can include about 40 wt. % to about 90 wt. % TiO$_2$, about 2 wt. % to about 30 wt. % of a PMMA/DMA-b-PBuA-b-PMMA/DMA copolymer, about 10 wt. % to about 20 wt. % of a phenoxy resin having a M$_w$ of about 50,000 to about 70,000 (e.g., PKFE), about 1 wt. % to about 5 wt. % of a phenoxy resin having a M$_w$ of about 20,000 to about 40,000 (e.g., PKHB), about 0.1 wt. % to about 2 wt. % a bisphenol F epoxy resin, about 0.1 wt. % to about 2 wt. % of a phenol novolac epoxy resin, about 1 wt. % to about 40 wt. % of a curing agent such as HXA-3922HP, about 0.2 wt. % to about 4 wt. % of a low surface area silica (e.g., CAB-O-SIL® L90), about 0.1 to about 2 wt. % of a high surface area silica (e.g., CAB-O-SIL® TS530), about 0.1 wt. % to about 1 wt. % of 2-methylbenzothiazole, about 0.01 wt. % to about 1 wt. % of γ-glycidoxypropyltriethoxysilane (e.g. Silquest A-187 silane), about 0.1 wt. % to about 5 wt. % of trimethylolpropane triglycidyl ether, and about 0.01 wt. % to about 1 wt. % of a silicone based surfactant (e.g., Silwet L-7622).

In some embodiments, the reflective adhesive layer further includes about 0.1 wt. % to about 5 wt. % of a cresol novolac epoxy resin.

In some embodiments, the non-reflective adhesive layer 22 has a thickness ranging from about 1 μm to about 25 μm. In some embodiments, the thickness of the non-reflective adhesive layer 22 ranges from about 1 μm to about 15 μm, and more specifically from about 1 μm to about 8 μm. For example, the non-reflective adhesive layer can have a thickness of about 2 μm to about 6 μm or about 3 μm to about 5 μm. In some embodiments, the non-reflective adhesive layer can have a thickness of about 4 μm, 5 μm, 6 μm, 8 μm or about 10 μm.

In some embodiments, the reflective adhesive layer 24 may have a thickness ranging from about 1 μm to about 10 μm, 2 μm to about 6 μm, or about 3 μm to about 5 μm. For example, the reflective adhesive layer can have a thickness of about 3 μm, 4 μm, 5 μm, or about 6 μm.

The reflective adhesive layer and the non-reflective adhesive layer can have a total thickness of about 6 μm to about 25 μm or about 6 μm to about 18 μm. In some embodiments, the reflective adhesive layer and the non-reflective adhesive layer have a total thickness of about 8 μm to about 12 μm. For example, the reflective adhesive layer and the non-reflective adhesive layer can have a total thickness of about 8 μm, 9 μm, 10 μm, 11 μm, or about 12 μm.

In some embodiments, the ACF can include quantum dots in the reflective adhesive layer, the non-reflective layer, or both to convert the incoming light or emitted light to a specific wavelength. Quantum dots can be single component materials with uniform internal compositions, such as chalcogenides (e.g., selenides, sulfides or tellurides) of metals (e.g., cadmium, lead or zinc, example, CdTe or PbS). Alternatively, core-shell type of alloy type quantum dots may be used. For example, core-shell quantum dots with cores including CdSe and shells including ZnS and alloy quantum dots such as CdS$_x$Se$_{1-x}$/ZnS, are available from Sigma-Aldrich. Other useful quantum dots can also be obtained from for example from Nanosys, (California), Ocean Nanotech (California), NanoOptical Materials Inc. (California) and NNCrystal, (Arkansas).

In some embodiments, a bottom surface 70 of the release substrate 26 may first be surface treated by, for example, corona treatment, before the reflective adhesive layer 24 is coated on the release substrate 26.

Figure 2:
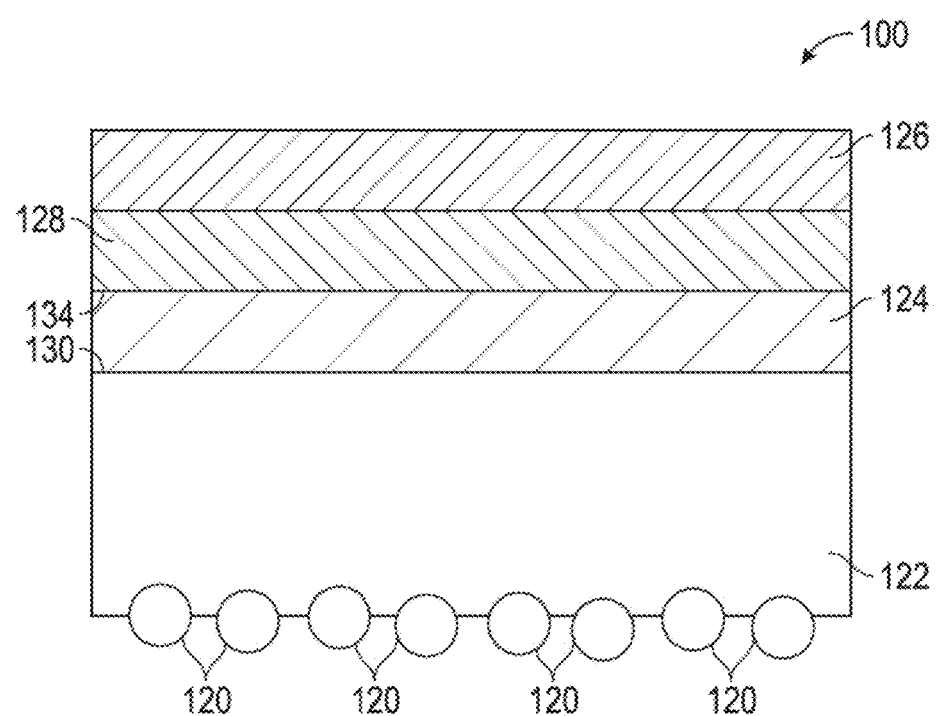
FIG. 2 is an alternative embodiment of the ACF shown in FIG. 1, where the ACF includes a thin film deposited reflective layer instead of the reflective adhesive layer.

FIG. 2 is alternative embodiment of an ACF 100, where the reflective layer 124 is deposited or coated on a top surface 130 of a non-reflective adhesive layer 122, for example, by thin film deposition such as, vapor deposition or sputtering. Neutral color metal or metal oxide layers such as silver (Ag), aluminium (Al), titanium dioxide (TiO$_2$), tin oxide (SnO), zinc oxide (ZnO), and their alloys having a thickness ranging from about 5 to about 300 nm thick, and in one specific embodiment about 10 to 100 nm thick may be used.

In the embodiment as shown in FIG. 2, the reflective layer 124 is a thin film deposited reflective layer that does not include an adhesive. Accordingly, the secondary or additional adhesive layer 128 may be disposed along a top surface 134 of the reflective layer 124 in order to make tacky contact with a viewing layer (shown in FIG. 2) once a release substrate 126 is removed. Specifically, the adhesive layer 128 makes tacky contact with the viewing layer upon assembly of an electronic product, such as an LED, which is described in greater detail below. The composition of the adhesive layer 128 may be the same as or different from either the non-reflective adhesive layer 122 or the reflective adhesive layer 124. The reflective layer 124 may be laminated or deposited onto the non-reflective adhesive layer 122. Alternatively, the reflective layer 124 may be first deposited onto the additional layer of adhesive 128, which is precoated on the release substrate 126, and the resultant thin film deposited adhesive is then laminated onto the non-reflective adhesive layer 122. The conductive particles 120 may then be filled into and transferred from a microcavity array (not shown) to the non-reflective adhesive layer 122.

Continuing to refer to FIG. 2, in the event a vapor deposition technique is used, the ACF 100 can be manufactured by a process where the reflective layer 124 is first deposited or coated by vapor deposition or sputtering on the surface 134 of the additional adhesive layer 128 which is pre-coated on the release substrate 126 and the non-reflective adhesive layer 122 may be coated onto the top surface of the thin-film reflective layer. Alternatively, the non-reflective adhesive layer 122 may be first coated on a release substrate (not shown) having a weaker adhesion than that of the interface of adhesive 128/release substrate 126. The non-reflective adhesive layer 122 is then transferred onto the 134 surface by a lamination process. Conductive particles 120 may then be filled into a microcavity array by a microfluidic filling process and subsequently transferred onto the non-reflective layer 122 using a particle transfer process disclosed in the '214 patent to Liang. Alternatively, turning back to FIG. 1, in an embodiment where the reflective pigment is a particle, the ACF 10 may be manufactured by first coating the reflective adhesive layer 24 onto either the bottom surface 70 of the release substrate 26. The non-reflecting adhesive layer 22 may then be coated directly onto the reflective layer 24 or transferred by a lamination as described herein. Then the conductive particles 20 may then be filled into a microcavity array by a microfluidic filling process and subsequently transferred onto the non-reflective layer 22 using a particle transfer process as disclosed in the '214 patent to Liang.

In some embodiments, the ACF can include quantum dots in the reflective layer, the non-reflective layer, or both to convert the incoming light or emitted light to a specific wavelength. Quantum dots can be single component materials with uniform internal compositions, such as chalcogenides (e.g., selenides, sulfides or tellurides) of metals (e.g., cadmium, lead or zinc, example, CdTe or PbS). Alternatively, core-shell type of alloy type quantum dots may be used. For example, core-shell quantum dots with cores including CdSe and shells including ZnS and alloy quantum dots such as $CdS_xSe_{1-x}/ZnS$, are available from Sigma-Aldrich. Other useful quantum dots can also be obtained from for example from Nanosys, (California), Ocean Nanotech (California), NanoOptical Materials Inc. (California) and NNCrystal, (Arkansas).

FIG. 3 (not-to-scale) is an exemplary illustration of a light-emitting device 72 including an array of LED chips (not shown) with chip bumps 80. The ACF 10 may be used to electrically connect the array of chip bumps 80 to the electrodes or traces (not shown) on the electrode substrate 76 of the light-emitting device 72. The light-emitting device 72 may further include optical and packaging subsystems (not illustrated). As seen in FIG. 3, the conductive particles 20 may be deformed into a generally elliptic shape by the chip bumps 80 during the bonding process in order to establish an improved vertical electrical connection. Light rays 82 emitted from the light emitting elements (not shown) on the chip bump 82 may pass through the light-emitting device 72 to reach an observer (not illustrated). The light emitting housing 74 may be a protective layer or an optical film with antireflection or antiglare properties laminated or coated on the light emitting element. As seen in FIG. 3, a portion of the light rays 82a may deflect along an upper surface 84 of the light-emitting housing 74 and are directed back towards the light-emitting element (not shown) on the chip bumps 80 or the space between the light emitting elements or bumps. The light rays 82a may then be reflected by the reflective adhesive layer 24 of the ACF 10 in the space between the chip bumps and the light emitting element in a direction back towards the upper surface 84 of the light-emitting housing 74. In other words, the reflective adhesive layer 24 of the ACF 10 is used to re-reflect light and also improve total light output.

Referring to both FIGS. 1 and 3, the light-emitting device 72 may be manufactured using a typical ACF/bonding process, where the ACF 10 is first placed on a top surface 88 of the electrode substrate 76, where the conductive particles 20 are facing down, against the top surface 88 of the electrode substrate 76. Pressure may then be applied to the ACF 10 and the electrode substrate 76 by a roller or stamp. In one embodiment, pressure is applied for about 1 second to about 3 seconds between about 70° C. to 80° C. at about 0.2 to about 0.3 MPa. The release substrate 26 (shown in FIG. 1) may then be removed to expose the reflective adhesive layer 24. The LED chips (not shown) may then be picked and placed on top of the ACF 10 with the chip bumps 80 facing the reflective adhesive layer 24. High pressure exerted by a chip bonder at about 150° C. to about 190° C. and 60 MPa for about 5 to about 20 seconds, to form a reliable electrical connection between the electrode substrate 76, and the chip bumps 80 through the deformed conductive particles 20 captured on the bump/electrode connection interface. Alternatively, the LED chips may be first picked and transferred onto a temporary receiving substrate to form an array of LED chips with the chip bumps 80 facing up (on the opposite side of the temporary receiving substrate). The array of LED chips of a predetermined pitch size is then flipped and transferred as a whole onto the ACF 10 pre-bonded on the electrode substrate 76 and subsequently bonded under high temperature and pressure as described above.

Figure 4:
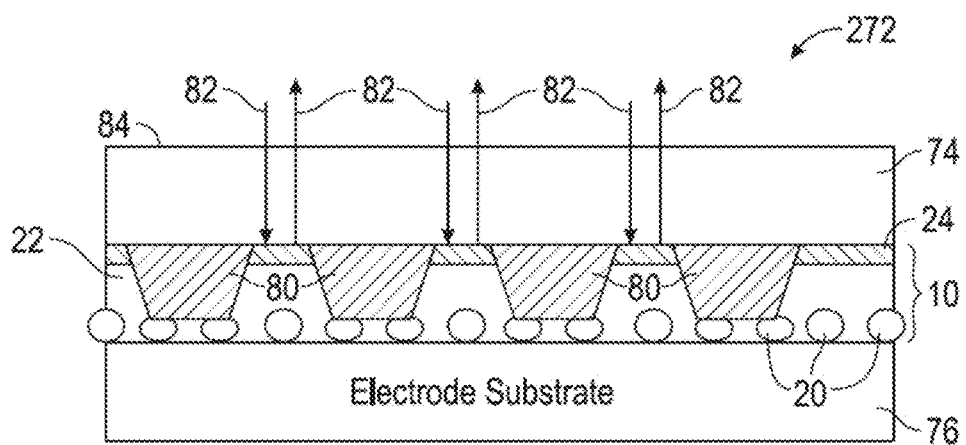
FIG. 4 is an exemplary light-transmitting device including the disclosed ACF shown in FIG. 1.

FIG. 4 is an illustration of a light-reflecting or transflecting device 272 that may be used with devices such as, for example, liquid-crystal displays (LCDs) and electronic paper displays (EPDs). The light-reflecting device 272 includes similar structure as the light-emitting device 72 shown in FIG. 3, except that the housing 74 does not include light-emitting elements such as LEDs or OLEDs. Instead, unlike the light-emitting device 72 shown in FIG. 3, light rays 82 are generated by an exterior source of light (not illustrated), and enter the light-reflecting device 272 through the upper surface 84 of the housing 74 from a viewing side, which is not illustrated. The light rays 82 may then be reflected by the reflective adhesive layer 24 of the ACF 10 in a direction back towards the upper surface 84 of the housing 74.

Referring generally to the figures, the disclosed ACF includes a reflective layer as well as a non-reflective adhesive layer. The reflective layer can achieve high reflectivity, while the non-reflective adhesive layer can facilitate the array transfer of conductive particles during the microfluidic transfer process. The reflective layer may be either a reflective adhesive layer (shown in FIG. 1), or a thin film deposited reflective layer (shown in FIG. 2). The reflective layer of the ACF results in improved light output and color purity characteristics when the ACF is part of a light-emitting, a light-transmitting or a transreflective device. Additionally, the 2-layer (reflective and non-reflective adhesive layers) ACF also results in improved attachment of the ACF 10 to the electrode substrate 76 (shown in FIG. 3) during pre-bonding. Those of ordinary skill in the art will readily appreciate that the improved bonding capability is an unexpected but desirable result, since reduced attachability of the ACF is typically experienced when the concentration of conductive particles is increased.

Example 1

Preparation of G Layer Fluid (G1):

An adhesive fluid including the following ingredients was prepared: 8 parts of M52N from Arkema, 16 parts of PKFE, 16 parts of PKHB from InChem Corp., 1.2 parts of 2-Methylbenzothiazole from Aldrich, 5.2 parts of MX257 from Kaneka Corp., 4.5 parts of YL983U from Japan Epoxy Resins Co., Ltd., 1.2 parts of Epalloy 8330 from CVC Thermoset Specialties, Moorestown, N.J., 0.5 parts of Silquest A-187, 5 parts of trimethylolpropane triglycidyl ether from Aldrich, 1 part of EPPN-501H from Nippon Kayaku, 0.6 parts of Silwet 7622 from Momentive, 3.6 parts of CAB-O-SIL L90, 0.3 parts of CAB-O-SIL TS530 from Carbot, 3 parts of $TiO_2$ (Ti-Pure R706) from DuPont, 33 parts of HXA 3922HP from Asahi Kasei, Japan, and 156 parts of ethyl acetate. All ingredients were either dissolved or well dispersed in ethyl acetate and filtered before coating.

Preparation of R Layer Fluid (R1).

An adhesive fluid including the following ingredients was prepared: 8 parts of M52N from Arkema, 13 parts of PKFE and 3 parts of PKHB from InChem Corp., 0.6 parts of 2-Methylbenzothiazole from Aldrich, 1.3 parts of YL980, 0.6 parts of YL983U from Japan Epoxy Resins Co., Ltd., 0.6 parts of Epalloy 8330 from CVC Thermoset Specialties, Moorestown, N.J., 0.2 parts of Silquest A-187, 4 parts of trimethylolpropane triglycidyl ether from Aldrich, 0.3 parts of Silwet 7622 from Momentive, 1 part of CAB-O-SIL L90, 0.3 parts of CAB-O-SIL TS530 from Carbot, 42 parts of $TiO_2$ (Ti-Pure R706) from DuPont, 25 parts of HXA 3922HP from Asahi Kasei, Japan, and 162 parts of ethyl acetate. All ingredients were either dissolved or well dispersed in ethyl acetate and filtered before coating.

Preparation of G Layer Fluid (G2).

An adhesive fluid including the following ingredients was prepared: 4.6 parts of M52N from Arkema, 18 parts of PKHB from InChem Corp., 5.0 parts of Epiclon N-695 from DIC Corp., 8.0 parts of YL980 from Japan Epoxy Resins Co., Ltd., 4.0 parts of YL983U from Japan Epoxy Resins Co., Ltd., 1.2 parts of Epalloy 8330 from CVC Thermoset Specialties, Moorestown, N.J., 0.5 parts of Silquest A-187 from Aldrich, 0.5 parts of trimethylolpropane triglycidyl ether from Aldrich, 1.2 parts of 2-Methylbenzothiazole from Aldrich, 1.0 parts of EPPN-501H from Nippon Kayaku, 0.6 parts of Silwet 7622 from Momentive, 5.4 parts of CAB-O-SIL L90, 11.00 parts of CAB-O-SIL TS530 from Carbot, 7.0 parts of $TiO_2$ (Ti-Pure R706) from DuPont, 32 parts of HXA 3922HP from Asahi Kasei, Japan, and 187 parts of ethyl acetate. All ingredients were either dissolved or well dispersed in ethyl acetate and filter before coating.

Preparation of R Layer Adhesive Fluid (R2).

An adhesive fluid comprising the following ingredients was prepared: 9 parts of M52N from Arkema, 18 parts of PKFE and 3 parts of PKHB from InChem Corp., 0.6 parts of 2-Methylbenzothiazole from Aldrich, 1.2 parts of YL980 and 0.6 parts of YL983U from Japan Epoxy Resins Co., Ltd., 0.6 parts of Epalloy 8330 from CVC Thermoset Specialties, Moorestown, N.J., 0.3 parts of Silquest A-187 and 1.8 parts of trimethylolpropane triglycidyl ether from Aldrich, 1.8 parts of Epiclon N-695 from DIC Corp., 0.3 parts of Silwet 7622 from Momentive, 1.1 parts of CAB-O-SIL L90 and 0.3 parts of CAB-O-SIL TS530 from Carbot, 57 parts of $TiO_2$ (Ti-Pure R706) from DuPont, 10 parts of HXA 3922HP from Asahi Kasei, Japan, and 166 parts of ethyl acetate. All ingredients were either dissolved or well dispersed in ethyl acetate and filtered before coating.

Examples 2-4

Example 2 was directed at studying the effects of $TiO_2$ concentration and adhesive thickness on the reflectance and transfer efficiency of conductive particles when making a fixed array ACF.

The adhesive fluid (R1) comprising about 42 wt. % $TiO_2$ (dried) was coated on a 50 μm-thick PET (polyethylene terephthalate) film with a doctor blade (Paul N. Gardner Company, Inc., Pompano Beach, Fla., USA) to obtain three coatings (R1-8), (R1-6) and (R1-4) with a target dry thickness of 8 μm, 6 μm, and 4 μm, respectively, after being dried in a 60° C. oven for 5 minutes.

The (R1-6) and (R1-4) coatings were then separately over-coated with the adhesive fluid (G1) containing about 3 wt. % (dried) of $TiO_2$ with a doctor blade to obtain two 2-layer adhesive coatings (G1-2/R1-6) and (G1-4/R1-4), respectively, having about the same total dry thickness of 8 μm after dried in a 60° C. oven for 5 minutes.

Figure 5:
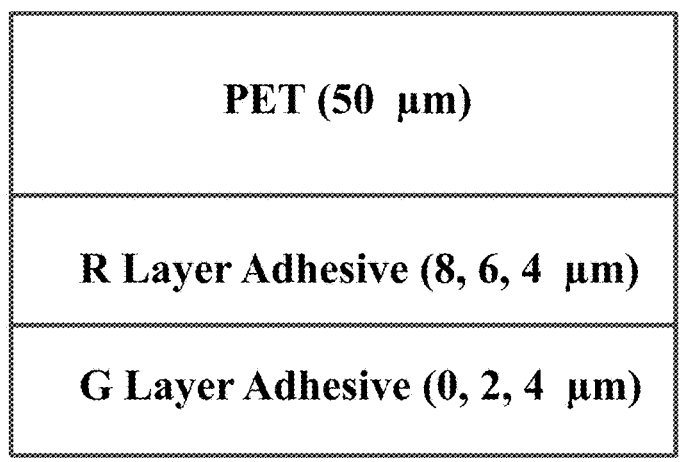
FIG. 5 is a side cross-sectional view of an exemplary two-layer adhesive on a release substrate (PET).

The schematic drawing of the 2-layer adhesives (G Layer+R Layer) on PET film is shown in FIG. 5.

Preparation of Fixed Array ACFs by Microfluidic Particle Filling and Transfer Processes.

Conductive particles (3.2 μm diameter, Bright 26GNR3.0—EHD, from Nippon Chemical Industrial Co. Ltd.) encapsulated with an insulating polymer as taught in U.S. Publication No. 2015/0072109 by Liang, et al., were filled and transferred by a microfluidic process onto the three coatings (R1-8), (G1-4/R1-4) and (G1-2/R1-6) as taught in U.S. Pat. Nos. 9,475,963; 9,352,539; 9,102,851; 8,802,214 and their continuations or CIPs also by Liang, et al, using a micro-cavity array film having micro-cavities of 9.5 μm pitch with an opening diameter of about 6 μm and a partition of about 3.5 μm (a 6×3.5 array), and a depth of about 4 μm. The particle transfer results are listed in Table 1.

TABLE 1

Conductive particle transfer results for Examples 2-4
($TiO_2$ wt. % in G layer and R layer are 3% and 42%, respectively)

| Sample ID | G-1 layer thickness | R-1 layer thickness | Conductive Particle Transfer Results |
|---|---|---|---|
| Example 2, Adhesive: R1-8 | 0 μm | 8 μm | No particle transfer |
| Example 3, Adhesive: G1-2/R1-6 | 2 μm | 6 μm | Poor particle transfer |
| Example 4, Adhesive: G1-4/R1-4 | 4 μm | 4 μm | Good particle transfer with acceptable uniformity |

It can be seen clearly from Table 1 that no conductive particles could be transferred onto the R1-8 adhesive film, which contained a high concentration (about 40 wt. %) of $TiO_2$. The overcoat of a G-1 layer having a low concentration (3 wt. %) of $TiO_2$ improved the particle transfer efficiency significantly. About a 4 μm of the G-1 adhesive layer allowed for a fixed array ACF of acceptable conductive particle transfer efficiency and uniformity. In brief, although the reflectance or whiteness of the ACF adhesive film may be improved by increasing the $TiO_2$ concentration, the adhesive became too rigid for conductive particles to be transferred onto the adhesive. Additional results indicated a high particle transfer efficiency and uniformity could be achieved by using adhesives containing a low concentration of $TiO_2$ but the reflectance or whiteness became too low to be useful to improve the brightness of a light emitting device in which the diode bump height is in the range of 8-12 μm. The reflectance or whiteness may be improved by increasing the adhesive thickness; however, the quality of electric connection of the diodes to the driving electrode traces deteriorates dramatically when the adhesive thickness is significantly higher than the diode bump height.

Examples 5-12

Eight adhesive fluids comprising various $TiO_2$ loadings ranging from 30 wt. % to 85 wt. % (Table 2) were prepared as described in the preparation of adhesive fluid (R2). Each of these fluids was coated separately on a 50 μm PET substrate with a doctor blade to obtain a dry coating thickness of 4 μm after being dried in a 60° C. oven for 5 minutes. The prepared coatings were then separately over-coated with the G1 adhesive fluid with a doctor blade to obtain a 2-layer adhesive coating having a total thickness of about 8 μm (G1-4 adhesive layer of about 4 μm thickness on each of the eight R adhesive layers also about 4 μm thickness) after dried in a 60° C. oven for 5 minutes.

A 2 cm×2 cm coupon was cut from each of the 2-layer adhesive coatings on PET film and placed on top of a microscope slide with G1 layer facing the microscope slide. The microscope slide with the coupon was compressed at 120° C., 80 psi for 5 second by a Ceratek® Laboratory Heat Sealer Model 4GL/1 (Sencorp Inc., Hyannis, Mass., USA) followed by a post cure step at 170° C., for 60 seconds on a hot plate. The PET film was peeled off from the cured samples before reflectance measurement by an integrating sphere in Shimadzu UV-2000 (Shimadzu Corp., Kyoto, Japan) with the G1 Layer facing the incident light. A bare microscope slide was used as a reference.

Additionally, a 1 cm×1 cm coupon was cut from each of the adhesive coatings of Examples 5-12 and placed on top of an ITO glass with the G adhesive layer facing the ITO. The samples were compressed and cured under heat and pressure as described above. The 90 degree peel forces of the cured samples were measured by the Instron 3367 Tensile Test Machine (Instron Corp., Norwood, Mass., USA) with a crosshead speed of 1.5 mm/sec. It was found that the peel force is too low (less than 300 g/cm) as compared with the specifications (>1000 g/cm) generally accepted in the industry, when $TiO_2$ wt. % in the R layer is higher than about 65%.

Example 13

High Particle Density Multi-tier fixed array ACFs having a total thickness of 10.5 μm and a high reflectance (56.5%) and high 90° peeling force (1294 g/cm).

The adhesive fluid R1 comprising about 42 wt. % of $TiO_2$ was coated on a 50 μm PET substrate with a doctor blade to obtain a reflective layer (R1-5) of 5 μm thickness after being dried in a 60° C. oven for 5 minutes.

The R1-5 coating on PET was then over-coated with the G1 adhesive coating fluid comprising about 3 wt. % of $TiO_2$ with a doctor blade to obtain a 2-layer adhesive coating (G1-4/R1-5) having total coating thickness of 9 μm after being dried in a 60° C. oven for 5 minutes.

Figure 7:
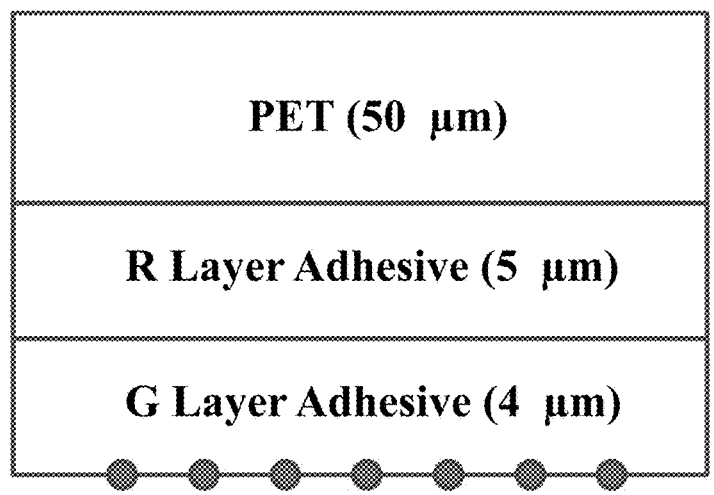
FIG. 7 is a side cross-sectional view of the adhesive of Example 13 having transferred array of conductive particles partially embedded into the G1-4 layer of the G1-4/R1-5 adhesive on a PET film.

A fixed array ACF-1 was prepared by the microfluidic conductive particle filling and transfer processes as described in Examples 2-4 using a 6×3.5 (6 μm opening and 3.5 μm partition) micro-cavity array. FIG. 7 shows the schematic drawing of the fixed array ACF having transferred conductive particles partially embedded into the G1-4 layer of the G1-4/R1-5 adhesive on a PET film.

Figure 8:
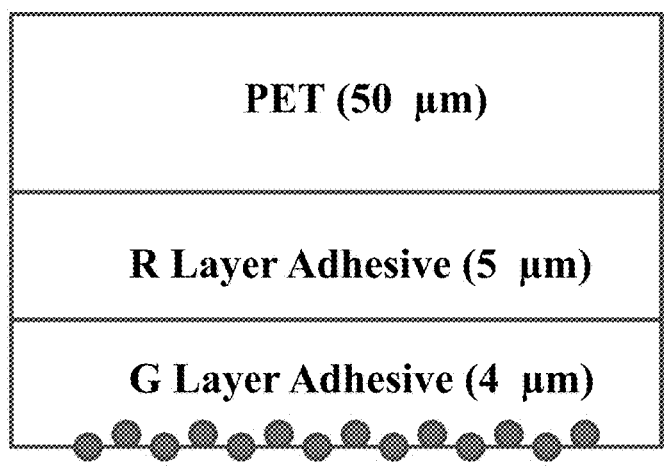
FIG. 8 is a side cross-sectional view of the adhesive of Example 13 having two tiers of arrays of conductive particles on the bottom surface of the G Layer with different particle embedding depths.

A second tier conductive particle array was then transferred onto the ACF-1 using the same 6×3.5 microcavity array to form a 2-tier fixed array ACF (ACF-2) having both tiers of conductive particles on the top surface of G Layer with different particle embedding depths as shown in the schematic FIG. 8.

TABLE 2

Reflectance of cured 2-layer adhesives (Examples 5-12) as a function of $TiO_2$ wt. % in the R Layer. (4 μm G1-4 layer over-coated on 4 μm R layers having various $TiO_2$ loadings)

|  | Example 5 | Example 6 | Example 7 | Example 8 | Example 9 | Example 10 | Example 11 | Example 12 |
|---|---|---|---|---|---|---|---|---|
| $TiO_2$ wt. % in the R Layer | 30.5% | 32.1% | 42.0% | 52.0% | 57.0% | 62.0% | 70.0% | 85.0% |
| Reflectance | 54.84% | 55.84% | 60.55% | 64.70% | 64.86% | 64.81% | 66.36% | 65.57% |

Figure 6:
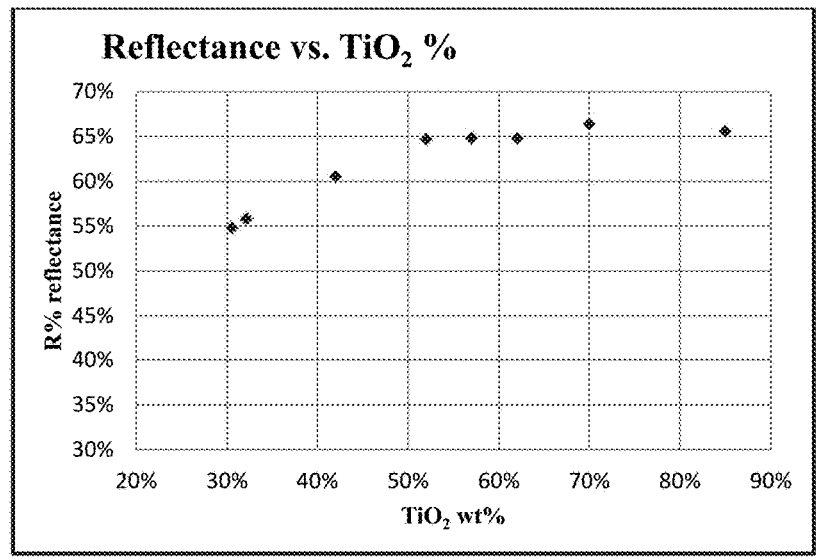
FIG. 6 is a graph depicting reflectance vs percent $TiO_2$ for Examples 5-12.

As can be seen from Table 2 and FIG. 6, the reflectance increases from about 54.8% to about 64.8% as the $TiO_2$ wt. % in the R Layer increases from 30.5% to 57%, but reaches a plateau of about 66% for samples containing more than 60 wt. % of $TiO_2$ wt. % in the R layer.

Notably, without the G1-4 adhesive layer overcoat, no process window was found for acceptable particle transfer directly onto the R layers comprising more than about 40 wt. % of $TiO_2$. The overcoat is critical for the preparation of high quality non-random or fixed array ACFs if a thin adhesive is needed to assure an acceptable diode or chip bump connection to the driving electrode traces for the manufacturing of high definition light emitting devices or displays of high brightness (high reflectance).

Figure 9:
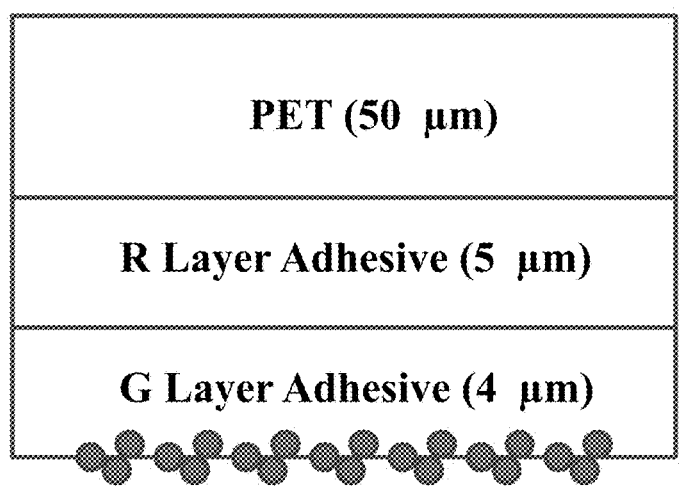
FIG. 9 is a side cross-sectional view of the adhesive of Example 13 having three tiers of arrays of conductive particles on the bottom surface of the G Layer with different particle embedding depths.

A third tier conductive particle array was transferred onto the surface of the 2-tier fixed array ACF (ACF-2) using a 6×4 (6 μm opening and 4 μm partition) micro-cavity array to form a 3-tier fixed array ACF (ACF-3). A schematic drawing of ACF-3 having all 3 tier particle arrays on the surface of G Layer is shown in FIG. 9.

Figure 10:
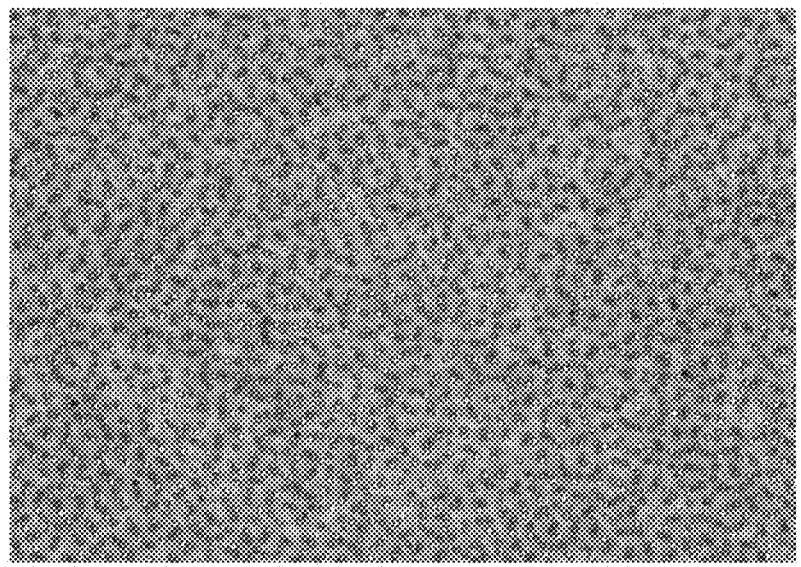
FIG. 10 is a 1000× photomicrograph of the ACF-3 prepared in Example 13.

The resultant ACF (ACF-3) had a total thickness of 10.5 μm (excluding the thickness of PET) and a particle density of 30541/mm². A 1000× photomicrograph of ACF-3 was prepared and is shown in FIG. 10.

The reflectance and 90° peel force of ACF-3 were 56.5% and 1294 g/cm, respectively, as measured according to the procedures described in Examples 5-12. The contact resistance, reflectance and 90° peel force met the minimum specifications of a high brightness, high definition light emitting devices after bonding the diodes onto the electrode traces with ACF-3.

Example 14

The adhesive fluid R2 comprising about 57 wt. % of $TiO_2$ was coated on a 50 μm PET film as described in Examples 13 to obtain a R2-4 coating of 4 μm thickness after being dried in a 60° C. oven for 5 minutes.

A 3-tier fixed array ACF-4 was prepared using the same conductive particle transfer process as described in Example 13 on thus prepared 2-layer adhesive (G2-4/R2-4).

Figure 11:
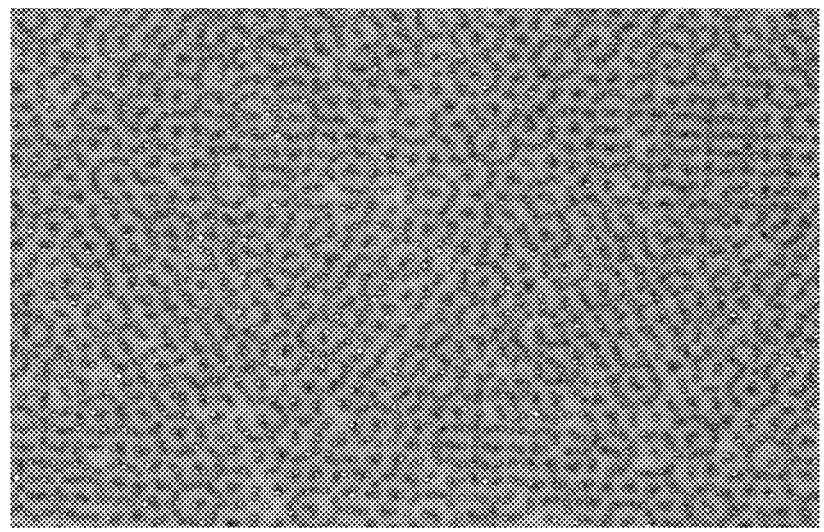
FIG. 11 is a 1000× photomicrograph of the ACF-3 prepared in Example 14.

The resultant ACF (ACF-4) has a thickness of 9.5 um (excluding the thickness of PET) and a particle density of 31834/mm². A 1000× photomicrograph of ACF-4 was prepared and is shown in FIG. 11.

The reflectance and 90° peel force of ACF-4 were 60.6% and 1231 g/cm, respectively, as measured according to the procedures described in Examples 5-12. The contact resistance, reflectance and 90° peeling forces met the specifications of a high brightness, high definition light emitting devices after bonding the diodes onto the electrode traces with ACF-4.

Example 15

In Example 15, a fixed-array ACF with a reflective adhesive layer laminated onto a non-reflective adhesive layer was produced. Specifically, an epoxy adhesive layer (I) composition comprising 31.5 parts of a phenoxy resin (PKFE) from InChem Corp., 5.2 parts of acrylic block copolymer M52N from Arkema Chemicals Company, 3.0 parts of bisphenol A diepoxide from Sigma-Aldrich, 4.0 parts of glycerol triepoxide from Sigma-Aldrich, 0.5 parts of Silwet 7622 from Momentive Performance Materials, Inc., 3.3 parts of CAB-O-Sil L90 from Cabot Corp., and 49.4 parts of HXA 3922 from Asahi Chemicals was coated on a 2 mil T-10 release film (a polyethylene terephthalate (PET) release liner from Eastman Chemical Company) with a target thickness of 6.0±0.5 um. A reflective adhesive layer (II) comprising 80 parts of the adhesive (I) and 20 part of titanium dioxide ($TiO_2$) (Ti-Pure R706 from DuPont) was coated with a target thickness of 5.5±0.5 um on a 2 mil PET substrate pre-treated with 0.08 to 0.10 kw corona immediately before the coating. The two coated films were laminated by a laminator at a speed of 6 feet per minute (fpm) with a roller temperature of about 60° C. The T-10 release film was peeled off, and the resultant epoxy composite adhesive film was further subjected to heat at 50° C. at 6 fpm. The total thickness of the resultant adhesive film was 11.5±0.5 um.

An array of microcavities of about 5 um (diameter of the opening) and about 3-4 um (depth) and 2-3 um (partition) was prefilled with conductive Au/Ni plated polymer particles of 3.2 um diameter by a microfluidic particle filling process, and the particles were subsequently transferred onto the above-mentioned composite adhesive film at 65° C., 5.5 fpm as taught in the '214 patent to Liang as well as U.S. Patent Publications 2014/0312501, 2014/0261992, and 2013/0071636, all to by Liang, et al. and are herein incorporated by reference in their entirety. The particle filling and transfer process were repeated to achieve a maximum conductive particle density of at least 30,000 pcs/mm², followed by a calendaring process at 70° C., 6 fpm to substantially push the conductive particles into the adhesive film.

Example 16

In Example 16, the above-described procedure of Example 15 was repeated, except that the thickness of the reflective adhesive layer (II) was reduced to 2.5±0.5 um and the total thickness of the resultant composite epoxy adhesive film was about 8.5±0.5 um. In both Examples 15 and 16, a satisfactory reflectivity of at least about 55% as measured by Perkin Elmer Lambda 35 UV/Vis Spectrometer using a clear (2.0 mil thickness) PET as the reference was achieved. The conductive particle density, particle capture rate after bonding, and the shear force of the bonded integrated circuit (IC) chip are shown in Table 3. As seen in Table 3, a particle transfer efficiency of at least 97% (the ratio of the number of conductive particle transferred onto the adhesive film after the microfluidic filling/transfer processes to the number of microcavities on the array) can be achieved with satisfactory (>35%) particle capture rate (defined as the % of particles captured in the overlapped area of the chip bump or electrode after bonding) and shear force (>25 MPa) after IC bonding. It should be noted that in Table 3, capture rate is determined on data obtained from a bump size of 1500 um².

TABLE 3

Particle Density, Capture Rate and Shear Force Performance Results

|  | Example 15 | Example 16 |
| --- | --- | --- |
| Conductive particle transferred (pcs/mm²) | 37,139 (>97% transfer efficiency) | 37,739 (>97% transfer efficiency) |
| Particle Capture Rate* | 36% | 37% |
| Shear Force (160 C. 5 s 60 MPa) | 30.0 MPa | 36.3 MPa |

*Capture rate is determined on data obtained from a bump size of 1500 um²

Example 17

In Example 17, a comparative fixed-array ACF without the reflective layer was produced. Specifically, a fixed-array ACF without a reflective layer was prepared using the procedure of Example 15, except that only the adhesive layer (I) of 11.5±0.5 um thickness was used.

Example 18

In Example 18, a comparative fixed-array ACF was produced. Specifically, a fixed-array ACF with a single adhesive layer (III) of 11.5±0.5 um thickness was prepared with the procedure of Example 17, except that the adhesive layer (III) contained a homogeneous mixture of the adhesive layer (I) and the reflective adhesive layer (II) of the Example 15.

The bonding attachment and the performance of the bonded chips of Examples 17 and 18 are shown in Tables 4-5. The ACF of comparative Example 17 containing only the non-reflective adhesive (I) layer showed a negligible reflectivity. Also, the ACF of Example 18 also showed a very low % (<1%) reflectance when compared to Example 15 having a composite adhesive layer (I)+(II), even though both of the ACFs contain exactly the same amount of the reflective pigment.

ACFs (both of thickness 11.5 um) were pre-bonded, and the attachment results are shown in Table 4. The ACF comprising composite adhesive layers (Example 15) exhibits an easier attachment to the ITO glass at bonding pressures and shorter bonding time than ACFs of Examples 17 and 18.

It may also be observed in Table 5 that the ACF of Examples 15 and 17 showed a significantly higher capture rate and shear force than Example 15. It was also found that the fixed-array ACF having composite reflective adhesive layers (Example 15) showed a higher particle transfer efficiency in the microfluidic particle filling/transfer processes than that of the ACF having a single mixture adhesive layer, even though the ingredients in the two examples are essentially the same.

TABLE 4

Attachment Results of the ACF to the ITO Glass at Varying Bonding Conditions

| Bonding Conditions* | | | Attachment | | |
|---|---|---|---|---|---|
| Temperature (° C.) | Pressure (MPa) | Time (s) | Example 15 | Example 17 | Example 18 |
| 80 | 0.3 | 1 | Pass | Pass | Pass |
| 80 | 0.2 | 1 | Pass | Pass | Fail |
| 70 | 0.3 | 1 | Pass | Fail | Fail |

*ACF from 5° C. storage, 1 hour warm-up at 25° C.

TABLE 5

Particle Density, Capture Rate, and Shear Force Performance Results of Non-Reflective ACF

| | Example 15 | Example 17 | Example 18 |
|---|---|---|---|
| Thickness | 11.5 um | 11.5 um | 11.5 um |
| Conductive particle transferred (pcs/mm²) | 37,139 (>97% transfer efficiency) | 37,611 (>97% transfer efficiency) | 30,273 (about 80% transfer efficiency) |
| Particle Capture Rate* | 36% | 18% | 24% |
| Shear Force (160 C. 5 s 60 MPa) | 30.0 MPa | 25.5 MPa | 18.0 MPa |

*Capture rate is determined on data obtained from a bump size of 1500 um²

Having described the disclosure in detail and by reference to specific embodiments thereof it will be apparent that numerous variations and modifications are possible without departing from the spirit and scope of the following claims.

What is claimed is:

1. An anisotropic conductive film (ACF), comprising:
a non-reflective adhesive layer including a top surface;
conductive particles at least partially embedded into a surface of the non-reflective adhesive layer, the conductive particles being substantially in the form of a perturbed array; and
a reflective adhesive layer disposed along the top surface of the non-reflective adhesive layer, wherein the reflective adhesive layer comprises at least 30% reflective particles by percentage weight of the reflective adhesive layer.

2. The ACF of claim 1, wherein the conductive particles are partially embedded along the surface of the non-reflective adhesive layer.

3. The ACF of claim 2, wherein the array of conductive particles is along a bottom surface of the non-reflective adhesive layer.

4. The ACF of claim 1, wherein the reflective particles are selected from the group consisting of: reflective and retro-reflective particles.

5. The ACF of claim 1, wherein the reflective particles are an electrical insulator.

6. The ACF of claim 1, wherein the reflective particles are high refractive index oxides selected from the group consisting of: indium-tin-oxide (ITO), zinc oxide (ZnO), titanium dioxide ($TiO_2$), indium-zinc-oxide (IZO), tin oxide (SnO), zirconium oxide ($ZrO_2$), their alloys thereof, and combinations thereof.

7. The ACF of claim 1, wherein the reflective particles comprise $TiO_2$.

8. The ACF of claim 1, wherein the reflective adhesive layer comprises filler particles selected from the group consisting of: zinc oxide (ZnO), boron nitride (SN), silicon dioxide ($SiO_2$), aluminum oxide ($Al_2O_3$), calcium carbonate ($CaCO_3$), calcium sulfate ($CaSO_4$), barium sulfate ($BaSO_4$), and combinations thereof.

9. The ACF of claim 1, wherein the reflective layer comprises about 40 wt. % to about 75 wt. % reflective particles.

10. The ACF of claim 1, wherein the ACF further comprises a release substrate disposed along a top surface of the reflective layer.

11. The ACF of claim 1, wherein the reflective adhesive layer has a thickness ranging from about 1 μm to about 15 μm.

12. The ACF of claim 1, wherein the reflective adhesive layer has a thickness ranging from about 3 μm to about 8 μm.

13. The ACF of claim 1, wherein the non-reflective adhesive layer comprises at least 20,000 pcs/mm² of the conductive particles.

14. The ACF of claim 1, wherein the ACF further comprises quantum dots in the non-reflective layer, the reflective layer, or both.

15. A light-emitting device, comprising:
a light-emitting housing comprising a plurality of light-emitting elements or chips, the chips comprising a chip bump for electrical connection to electrodes of an electrode substrate;
an electrode substrate; and
an anisotropic conductive film (ACF) electrically connecting the light-emitting elements or the chip bump to the electrodes of the electrode substrate, comprising:
a non-reflective adhesive layer including a top surface;
conductive particles at least partially embedded into a surface of the non-reflective adhesive layer, the conductive particles being substantially in the form of a perturbed array; and
a reflective adhesive layer disposed along the top surface of the non-reflective adhesive layer, wherein the reflective adhesive layer includes at least 30% reflective particles by percentage weight.

16. The light emitting device of claim 15, wherein the conductive particles are at an interface between the non-reflective adhesive layer and the reflective adhesive layer.

17. The light emitting device of claim 15, wherein the perturbed conductive particle array is substantially located near the interface or interphase between the reflective layer and non-reflective layer.

18. The light-emitting device of claim 15, wherein the perturbed conductive particle array is substantially located near the chips or electrodes bonded by the ACF.

19. The light-emitting device of claim 15, wherein the reflective layer comprises about 40 wt. % to about 75 wt. % reflective particles.

20. The light-emitting device of claim 15, wherein the reflective particles are high refractive index oxides selected from the group consisting of: indium-tin-oxide (ITO), zinc oxide (ZnO), titanium dioxide ($TiO_2$), indium-zinc-oxide (IZO), tin oxide (SnO), zirconium oxide (ZrO$_2$), their alloys thereof, and combinations thereof.

21. The light-emitting device of claim 15, wherein the reflective particles comprise TiO$_2$.

22. The light-emitting device of claim 15, wherein the reflective layer comprises filler particles selected from the group consisting of: zinc oxide (ZnO), boron nitride (SN), silicon oxide (SiO$_2$), aluminium oxide (Al$_2$O$_3$), calcium carbonate (CaCO$_3$), calcium sulfate (CaSO$_4$), barium sulfate (BaSO$_4$), and combinations thereof.

23. The ACF of claim 15, wherein the ACF further comprises quantum dots in the non-reflective layer, the reflective layer, or both.

24. The light-emitting device of claim 15, wherein the ACF is at least partially cured.

25. A light-reflecting or transflecting device, comprising:
a housing;
an electrode substrate;
an anisotropic conductive film (ACF) electrically connecting the housing and the electrode substrate, comprising:
  a non-reflective adhesive layer including a top surface;
  a plurality of conductive particles included with the non-reflective adhesive layer, the conductive particles being substantially in the form of a perturbed array; and
  a reflective adhesive layer disposed along the top surface of the non-reflective adhesive layer, wherein the reflective adhesive layer includes at least 30% reflective particles by percentage weight; and
a plurality of chip bumps or thin film transistors in contact with at least a portion of the conductive particles.

26. The light-reflecting or transflecting device of claim 25, wherein the conductive particles are at an interface between the non-reflective adhesive layer and the reflective adhesive layer.

27. The light-reflecting or transflecting device of claim 25, wherein the perturbed conductive particle array is substantially located near the interface or interphase between the reflective layer and non-reflective layer.

28. The light-reflecting or transflecting device of claim 25, wherein the perturbed conductive particle array is substantially located near the chips, thin film transistors, or electrodes bonded by the ACF.

29. The light-reflecting or transflecting device of claim 25, wherein the reflective layer comprises about 40 wt. % to about 75 wt. % reflective particles.

30. The light-reflecting or transflecting device of claim 25, wherein the reflective particles are high refractive index oxides selected from the group consisting of: indium-tin-oxide (ITO), zinc oxide (ZnO), titanium dioxide (TiO$_2$), indium-zinc-oxide (IZO), tin oxide (SnO), zirconium oxide (ZrO$_2$), and their alloys thereof.

31. The light-reflecting or transflecting device of claim 25, wherein the reflective particles comprise TiO$_2$.

32. The light-reflecting or transflecting device of claim 25, wherein the reflective layer comprises filler particles selected from the group consisting of: zinc oxide (ZnO), boron nitride (SN), silicon oxide (SiO$_2$), aluminium oxide (Al$_2$O$_3$), calcium carbonate (CaCO$_3$), calcium sulfate (CaSO$_4$), barium sulfate (BaSO$_4$), and combinations thereof.

33. The ACF of claim 25, wherein the ACF further comprises a quantum dot in the non-reflective layer, the reflective layer, or both.

34. The light-reflecting or transflecting device of claim 25, wherein the ACF is at least partially cured.

* * * * *